United States Patent
Coleiny et al.

(10) Patent No.: US 8,928,023 B1
(45) Date of Patent: Jan. 6, 2015

(54) ARRANGEMENT OF SOLID STATE LIGHT SOURCES AND LAMP USING SAME

(71) Applicants: Golshan Coleiny, Rockport, MA (US); Shiyong Zhang, Boxborough, MA (US)

(72) Inventors: Golshan Coleiny, Rockport, MA (US); Shiyong Zhang, Boxborough, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 0 days.

(21) Appl. No.: 13/962,377

(22) Filed: Aug. 8, 2013

(51) Int. Cl.
*H01L 33/00* (2010.01)
*H01L 27/15* (2006.01)

(52) U.S. Cl.
CPC .................. *H01L 27/153* (2013.01)
USPC ............... 257/98; 257/E23.01; 362/249.02

(58) Field of Classification Search
CPC .......................................... H01L 33/00
USPC ........... 257/98, 99, E23.01; 362/249.02, 231, 362/555; 313/498
See application file for complete search history.

(56) References Cited

U.S. PATENT DOCUMENTS

| | | | |
|---|---|---|---|
| 6,814,463 B2 | 11/2004 | Mele | |
| 6,957,905 B1* | 10/2005 | Pritchard et al. | 362/554 |
| 7,431,477 B2 | 10/2008 | Chou et al. | |
| 8,096,675 B1 | 1/2012 | Posselt | |
| 8,174,189 B2 | 5/2012 | Kim et al. | |
| 8,368,315 B2 | 2/2013 | Gaines et al. | |
| 8,641,702 B2* | 2/2014 | Pilcher et al. | 606/9 |
| 2009/0086475 A1* | 4/2009 | Caruso et al. | 362/231 |
| 2010/0290228 A1* | 11/2010 | Chern et al. | 362/249.02 |
| 2012/0287620 A1 | 11/2012 | Guerrieri | |
| 2013/0088142 A1 | 4/2013 | Allen | |

* cited by examiner

*Primary Examiner* — Selim Ahmed
(74) *Attorney, Agent, or Firm* — Edward S. Podszus (57) ABSTRACT

Arrangements of solid state light sources for color-mixing, and light sources including the same, are provided. A substrate has a plurality of different color LED chips coupled thereto. The emitted light is mixed to produce a white light output. The LED chips are arranged on the substrate in a manner that improves color-mixing, for example, by forming LED sets including one or more LED chips of different colors, by skewing the LED chips, and/or by forming a non-rectangular array or a circular array of LED sets and/or chips. The color-mixing LED arrangement may be used in a lamp or other light source together with collimating optics to collimate and further mix the color-mixed light output from the LED arrangement. The color-mixing LED arrangement may be provided as a single package with multiple LED chips or as multiple packages of one or more LED chips.

15 Claims, 5 Drawing Sheets

ARRANGEMENT OF SOLID STATE LIGHT SOURCES AND LAMP USING SAME

TECHNICAL FIELD

The present disclosure relates to lighting, and more specifically, to color mixing of solid state light sources.

BACKGROUND

Solid state light sources are increasingly used in lighting because of their energy efficiency and continually decreasing costs. The use of solid state light sources in lighting is generally disclosed in the following: U.S. Pat. No. 6,773,139 (Sommers); U.S. Pat. No. 6,814,463 (Mele); and U.S. Patent Application Publication No. 2008/0019130 (Wang).

White light may be produced from solid state light sources in a variety of ways. For example, one or more solid state light sources may be mounted on a substrate, such as but not limited to a printed circuit board. The one or more solid state light sources, which typically emit light of a wavelength that produces a blue color, may be covered with a phosphor and/or a mixture of phosphors, either directly within the package or remotely, to provide phosphor conversion of the light emitted from the underlying one or more solid state light sources to produce white light. Alternatively, combinations of two or more different "colors" (i.e., wavelengths of light corresponding to distinct colors) of light may be mixed together to produce white light. Color-mixing is disclosed in the following: U.S. Pat. No. 7,431,477 (Chou); U.S. Pat. No. 8,174,189 (Kim); U.S. Pat. No. 8,096,675 (Posselt); U.S. Pat. No. 8,368,315 (Gaines); U.S. Patent Application Publication No. 2012/0287620 (Guerrieri); and U.S. patent Application Publication No. 2013/0088142 (Allen).

Although the technique of color mixing using different color solid state light sources on a printed circuit board (PCB) is known, there have been challenges to provide uniform and efficient color mixing when more than two color LEDs are adjacent to each other. These challenges include resolving color separation due to different color LEDs on the PCB and improving light output uniformity without using additional optics. Mounting different color LEDs on a PCB also presents other challenges with weak heat dissipation and a complicated circuit design.

SUMMARY

Embodiments of the present disclosure provide an arrangement of solid state light sources optimized for uniform and efficient color-mixing with improved heat dissipation and a less complicated circuit design.

In an embodiment, there is provided an arrangement of solid state light sources. The arrangement includes a substrate and a plurality of solid state light source sets arranged on respective solid state light source regions of the substrate. Each of the solid state light source sets including at least a first color solid state light source chip, a second color solid state light source chip, and a third color solid state light source chip. Within each light source set, the first, second, and third solid state light source chips are coupled to the substrate and are arranged immediately adjacent to each other. The first color solid state light source chip is configured to emit light of a first wavelength. The second color solid state light source chip is configured to emit light of a second wavelength different than the first wavelength. The third color solid state light source chip is configured to emit light of a third wavelength different than the first and the second wavelengths.

Each of the solid state light source sets is also immediately adjacent at least two other solid state light source sets. The solid state light source chips in at least one of the solid state light source sets are skewed relative to the solid state light source chips in at least another of the solid state light source sets. At least a subset of the solid state light source sets (i.e., at least half of all the solid state light source sets on the substrate) is located on an imaginary circle. Respective solid state light source sets within the subset are spaced from an immediately adjacent solid state light source set by a distance exceeding a separation amount between immediately adjacent first, second, and third solid state light source chips within each solid state light source set.

The first color solid state light source chips are connected in electrical series defining a first string comprising a plurality of the first color solid state light source chips. The second color solid state light source chips are connected in electrical series defining a second string comprising a plurality of the second color solid state light source chips. The third color solid state light source chips are connected in electrical series defining a third string comprising a plurality of the third color solid state light source chips. The first, second and third strings of solid state light source chips are arranged in approximate concentric first, second and third circles each generally concentric with the imaginary circle.

BRIEF DESCRIPTION OF THE DRAWINGS

Reference should be made to the following detailed description which should be read in conjunction with the following figures, wherein like numerals represent like parts.

DETAILED DESCRIPTION

As used herein, the term solid state light source is used generally to refer to one or more light emitting diodes (LEDs), organic light emitting diodes (OLEDs), polymer light emitting diodes (PLEDs), and any other semiconductor device that emits light, and including combinations thereof. A solid state light source includes, in some embodiments, more than one solid state light source connected in parallel, series, and/or combinations thereof. Further, a solid state light source includes, in some embodiments, a single semiconductor die, a single semiconductor die packaged on an individual substrate, a set of semiconductor dies on a single substrate, a chip including multiple sets of semiconductor dies, and combinations thereof. For convenience, the term LED is used interchangeably herein with the term solid state light source.

As used herein, the term, "color" is generally used to refer to a property of radiation that is perceivable by an observer and the term "different colors" implies two different spectra with different dominant wavelengths and/or bandwidths. In addition, "color" may be used to refer to white and non-white light. Use of a specific color to describe an LED or the light emitted by the LED refers to a specific range of dominant wavelengths associated with the specific color. In particular, the term "red" when used to describe an LED or the light emitted by the LED means the LED emits light with a dominant wavelength between 610 nm and 750 nm and the term "amber" refers to red light with a dominant wavelength more specifically between 610 nm and 630 nm. The term "green" when used to describe an LED or the light emitted by the LED means the LED emits light with a dominant wavelength between 495 nm and 570 nm and the term "mint" refers to white light and/or substantially white light that has a greenish element to the white light such that it is above the Planckian curve and is in and/or substantially in the green color space of the 1931 CIE chromaticity diagram. The term "blue" when used to describe an LED or the light emitted by the LED means the LED emits light with a dominant wavelength between 430 nm and 490 nm. The term "yellow" when used to describe an LED or the light emitted by the LED means the LED emits light with a dominant wavelength between 570 nm and 600 nm. The term "white" generally refers to white light with a correlated color temperature (CCT) between about 2600 and 8000 K, "cool white" refers to light with a CCT substantially above 3600K, which is more bluish in color, and "warm white" refers to white light with a CCT of between about 2600 K and 3600 K, which is more reddish in color.

As used herein, the term "skewed" refers to one or more sides of an LED chip having an oblique or slanting direction or position relative to one or more sides of another LED chip. As used herein, the term "non-rectangular array" refers to an array in which the elements of the array (e.g., LED chips) are not arranged in a rectangular grid defined by rectangular coordinates such as x,y displacements from an array center. The term "circular array" refers to an array in which the elements of the array are more easily defined with polar coordinates, such as displacement from an array center (c) along a radius (r) and at a displacement angle (θ), than with rectangular coordinates.

Figure 1:
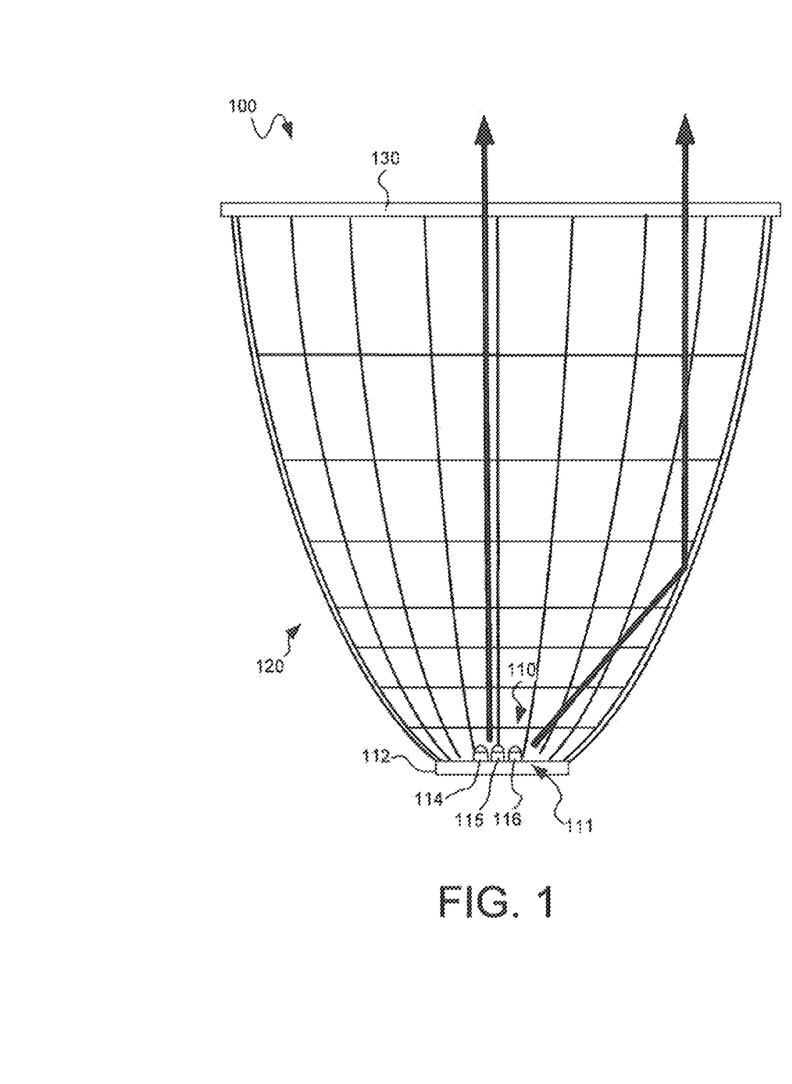
FIG. 1 is a side view of a lamp including an arrangement of solid state light sources according to embodiments disclosed herein.

In FIG. 1, a lamp 100 includes an arrangement of LEDs 110, an optical system such as but not limited to a faceted reflector 120, and a diffuser 130. The arrangement of LEDs 110 provides a light source that emits and mixes different color light to produce white light. The faceted reflector 120 reflects, collimates, and further mixes the light emitted by the arrangement of LEDs, and the diffuser 130 scatters and further mixes the light as the light passes out of the lamp 100. The lamp 100 may be used, for example but not limited to, in spot light applications with a beam angle of less than 25° and in some embodiments 20° or less. In other embodiments, an arrangement of LEDs 110 may be used in other types of lamps with other types of collimating optics and for other applications, for example, in lights with a beam angle of greater than 25° including flood lights with a beam angle of greater than 40°. The arrangement of LEDs 110 may be used in various lighting systems including, without limitation, a PAR type lamp (e.g., PAR30), a BR type lamp (e.g., BR30), and down light lamps.

The arrangement of LEDs 110 includes a substrate 112 and a plurality of different color LED chips 114-116 coupled to the substrate 112. As described in greater detail below, the arrangement of LEDs 110 may include three or more LED chips 114-116 that emit light of three or more different colors. The LED chips 114-116 may be arranged on the substrate 112 in a manner that facilitates color-mixing with a high efficiency light output and improved light output uniformity. In particular, the LED chips 114-116 may be arranged, for example, by forming LED sets 111 including a pattern of LED chips 114-116 of different colors, by skewing the LED chips, and/or by forming a non-rectangular array or a circular array of LED sets and/or chips, as described in greater detail below. The LED chips 114-116 may also be arranged, coupled to the substrate 112, and electrically connected in a manner that improves heat dissipation with a simpler circuit design, as described in greater detail below.

In some embodiments, the LED chips 114-116 emit light of different colors including, for example but not limited to, green, mint, red, amber, blue, blue/white, white and yellow. One or more of the LED chips 114-116 may include phosphor-converted LED chips including a blue-emitting LED, such as but not limited to a III-Nitride LED, as an excitation source for a phosphor containing element, such as a phosphor plate or tile, covering the blue-emitting LED. The substrate 112 may include a circuit board made of, for example but not limited to, a ceramic, ceramic with metal vias, or metal core PCB including at least three layers—a metal baseplate, insulating dielectric, and metal circuit. The LED chips 114-116 may be mechanically and electrically coupled to conductive pads (not shown) on the substrate 112 using known techniques such as, but not limited to, reflow soldering, epoxy bonding, and wirebonding.

The LED chips 114-116 may be, and in some embodiments are, arranged within a relatively small area on the substrate 112 such that the colors are mixed with uniformity. The actual performance may be subject to factors including, without limitation, efficiency of the LED chips and phosphor, the number of LED chips, the drive current, the density of the LED chips, and the operating temperature. The exact size, number and arrangement of the LED chips 114-116 depends upon the desired properties of the light source and the application. Various possible arrangements of LED chips are discussed in greater detail below.

Other components, such as a photo-voltaic (PV) or color sensor chip, may also be, and in some embodiments are, coupled to the substrate 112. Driver circuitry (not shown) may be coupled to the LED chips 114-116 (e.g., via traces on the substrate 112) for driving the different color LED chips 114-116 to achieve a desired mixing of the colors. One example of driver circuitry is described in greater detail in commonly-owned U.S. patent application Ser. No. 13/471,650, entitled "DRIVER CIRCUIT FOR SOLID STATE LIGHT SOURCES", the entire contents of which is incorporated herein by reference. The combination of the arrangement of LEDs 110 and the driver circuitry may be referred to as an LED light engine. An LED light engine with the arrangement of LEDs 110, consistent with the embodiments described herein, may be used to provide a tunable correlated color temperature (CCT), for example, from 2700K to 6000K.

The faceted reflector 120 may, and in some embodiments does, include an aluminum coated faceted reflector to reflect, collimate and further mix the light. Other embodiments of the lamp 100 may use other types of reflectors, such as but not limited to a smooth parabolic reflector. The diffuser 130 may, and in some embodiments does, include a micro-structured polymer diffuser plate that scatters light, for example, with a scattering angle of about 5 to 10 degrees. In one example, the distance between the substrate 112 and the diffuser 130 may be at least about 40 mm to provide acceptable color mixing quality. In other embodiments, other types of diffusers may be used or the diffuser may be eliminated.

The LED chips 114-116 may include individually-packaged LEDs (as shown in FIG. 1) coupled to the substrate 112. Each of the individually-packaged LEDs may include a single LED die attached to an individual substrate with a respective optic. One example of an individually-packaged LED, such as an OSLON® LED available from OSRAM Opto Semiconductors of Regensburg, Germany, includes a single LED die attached to an individual substrate and encapsulated with a light transmissive material such as silicone. The light transmissive material may form a dome that provides a full width half maximum (FWHM) beam angle of about 120° or greater. Providing a relatively high beam angle for each of the LED chips 114-116 facilitates color mixing. Other types of individually-packaged LEDs may also be used. In these embodiments, the substrate 112 may be a metal core PCB and the individually-packaged LEDs may be electrically and thermally coupled to the metal core PCB, as will be described in greater detail below.

Figure 2:
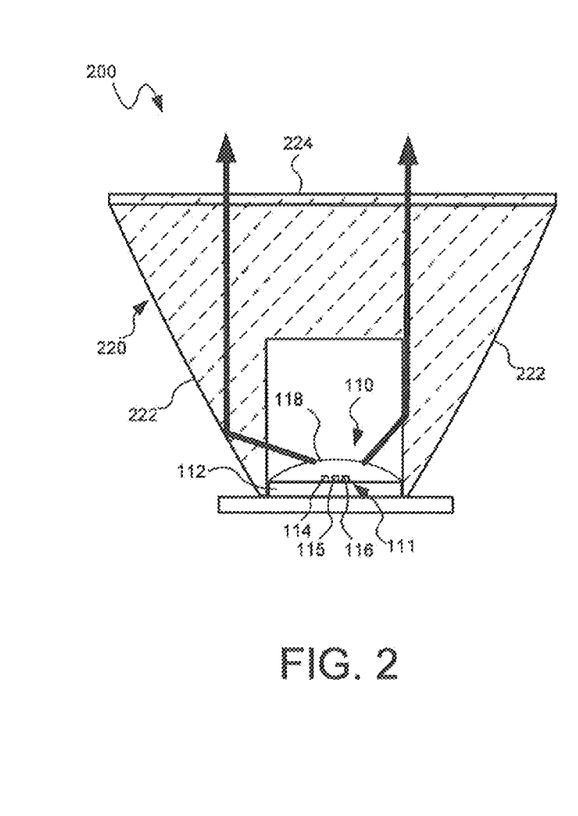
FIG. 2 is a side view of another embodiment of a lamp including an arrangement of solid state light sources according to embodiments disclosed herein.

Although the arrangement of LEDs 110 in the embodiments described herein is designed for light engines without secondary optics, the arrangement of LEDs 110 may be used in other types of lamps with secondary optics. As shown in FIG. 2, for example, another embodiment of a lamp 200 includes a total internal reflection (TIR) optic 220 for reflecting, collimating and further mixing the LED light. Some embodiments of the lamp 200 with TIR optics 220 include faceted sidewalls 222 and a textured top surface 224 for further color-mixing. Other embodiments of the lamp 200 with TIR optics 220 may include a diffuser sheet (not shown) for scattering and further mixing the light. When used with TIR optics 220 to provide a narrow beam, the LED arrangements and/or the TIR optics may be modified, in a manner known to one skilled in the art, to provide higher quality color mixing.

In other embodiments, the LED chips 114-116 may include LED die directly bonded to the circuit board substrate 112 to form a multiple LED "chip on board" (COB) package. Using COB technology with a ceramic substrate, for example, allows close LED chip spacing (e.g., −0.1 mm edge to edge), small circuit features (e.g., 50-100 micron minimum trace widths and spacing), and excellent thermal management for generating a high flux from a small area. In these embodiments, the LED chips 114-116 are encapsulated together with a light transmissive dome 118 (shown in FIG. 2). The different color light emitted from the LED chips 114-116 is mixed as the light passes through the dome 118, thereby providing good source-level color mixing. The dome 118 may include a low profile encapsulant (e.g., a clear silicone) dome that provides a full width half maximum (FWHM) beam angle of greater than 120° beam and about 150° FWHM in some embodiments. The dome 118 may be, and in some embodiments is, molded over the LED chips 114-116 on the substrate 120, for example, using a polished aluminum mold to provide a relatively smooth surface finish to improve optical efficiency. The dome 118 may also be, and in some embodiments is, a hemisphere dome to provide greater light extraction but with less color uniformity.

FIGS. 1 and 2 show the lamps 100, 200 with a single arrangement of solid state light sources or LEDs 110 and associated light collimating optics. Other embodiments may include multiple arrangements of LEDs 110 and associated reflectors or TIR optics. The multiple arrangements of LEDs 110 may be used, for example but not limited to, in a spotlight module with three color-mixing multiple LED arrangements 110 (e.g., 5 Watts each) and three associated reflectors or TIR optics.

Figure 3:
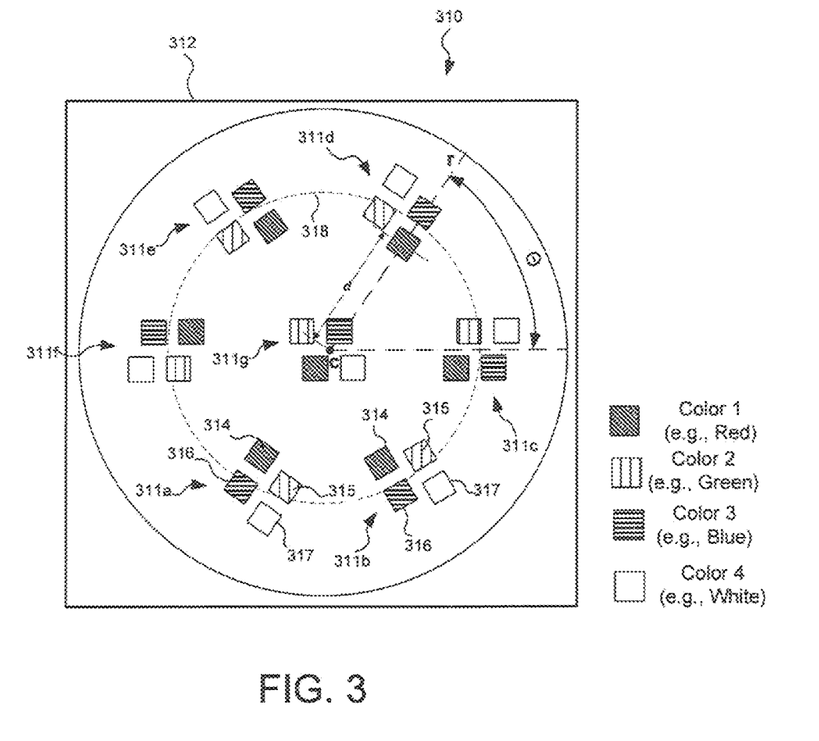
FIG. 3 is a schematic top view of an arrangement of solid state light sources according to embodiments disclosed herein.

Referring to FIG. 3, one embodiment of a color-mixing multiple LED arrangement 310 includes a plurality of LED sets 311a-g each having four LED chips 314-317 of four different colors arranged on respective LED regions on a substrate 312. The LED chips 314-317 in at least one of the LED sets 311a-g are skewed relative to the LED chips 314-317 in at least another of the LED sets 311a-g to allow arrangement in a circular array such that each of the LED sets 311a-g is immediately adjacent two other such LED sets 311a-g in the circular array. The LED chips 314-317 in each of the LED sets 311a-g are arranged immediately adjacent to each other (i.e., without other LED chips in between). In each of the LED sets 311a-g, a first color LED chip 314 is configured to emit light with a first dominant wavelength, a second color LED chip 315 is configured to emit light with a second dominant wavelength different than the first wavelength, a third color LED chip 316 is configured to emit light with a third dominant wavelength different than the first and second wavelengths, and a fourth color LED chip 317 is configured to emit white light or light with a fourth dominant wavelength different that the first, second and third wavelengths.

The LED sets 311a-g and the individual LED chips 314-317 are arranged in a circular array on the substrate 312 to facilitate color-mixing. In other words, each of the LED chips 314-317 is located at a displacement d from an array center (c) along a radius (r) and at displacement angle θ. The LED sets 311a-g are also arranged such that a subset of the LED sets 311a-f (i.e., at least half of the LED sets 311a-g on the substrate 312) is located on an imaginary circle 318. In the illustrated embodiment, the LED sets 311a-f are located on the imaginary circle 318 and one LED set 311g is located at the center of the circle 318. Each of the LED sets 311a-f located on the imaginary circle 318 are spaced from immediately adjacent LED sets 311a-f by a distance exceeding a separation amount between immediately adjacent LED chips 314-317 within each of the LED sets 311a-g.

As described in greater detail below, the LED chips 314-317 of a single color in the LED sets 311a-g are connected in electrical series to define a first string of the first color LED chips 314, a second string of the second color LED chips 315, a third string of the third color LED chips 316, and a fourth string of the fourth color LED chips 317. These first, second, third and fourth strings of LED chips 314-317, respectively, are also arranged in approximate circles generally concentric with the imaginary circle 318.

The LED chips 314-317 thus extend symmetrically in radial and angular directions such that the different colors are substantially balanced to improve color mixing. Arranging the LED chips 314-317 in the circular array with the different colors balanced in the angular direction allows good color mixing when used in a circular lamp with a circular aperture. Although the illustrated embodiment shows the LED chips 314-317 arranged in a circular array, other embodiments may include skewed LED chips arranged in other non-rectangular arrays. The illustrated embodiment with seven (7) LED sets 311a-g is designed for a down light application. Other numbers of LED sets may also be used depending on the desired light level and light engine application.

In one example, the first color is red, the second color is green, the third color is blue, and the fourth color is white. In another example, the first color is amber, the second color is mint, the third color is blue/white, and the fourth color is yellow. Other colors and color combinations are also within the scope of the present disclosure. As shown, each of the LED sets 311a-g may have the same color ratio (1:1:1:1) as the overall color ratio of the LED arrangement 310 on the substrate 312. In other words, the first to second to third to fourth color ratio is 1:1:1:1 in each of the LED sets 311a-g and in the LED arrangement 310. Although the LED chips 314-317 are substantially the same size in the illustrated embodiment, different size LED chips 314-317 may be used.

Figure 4:
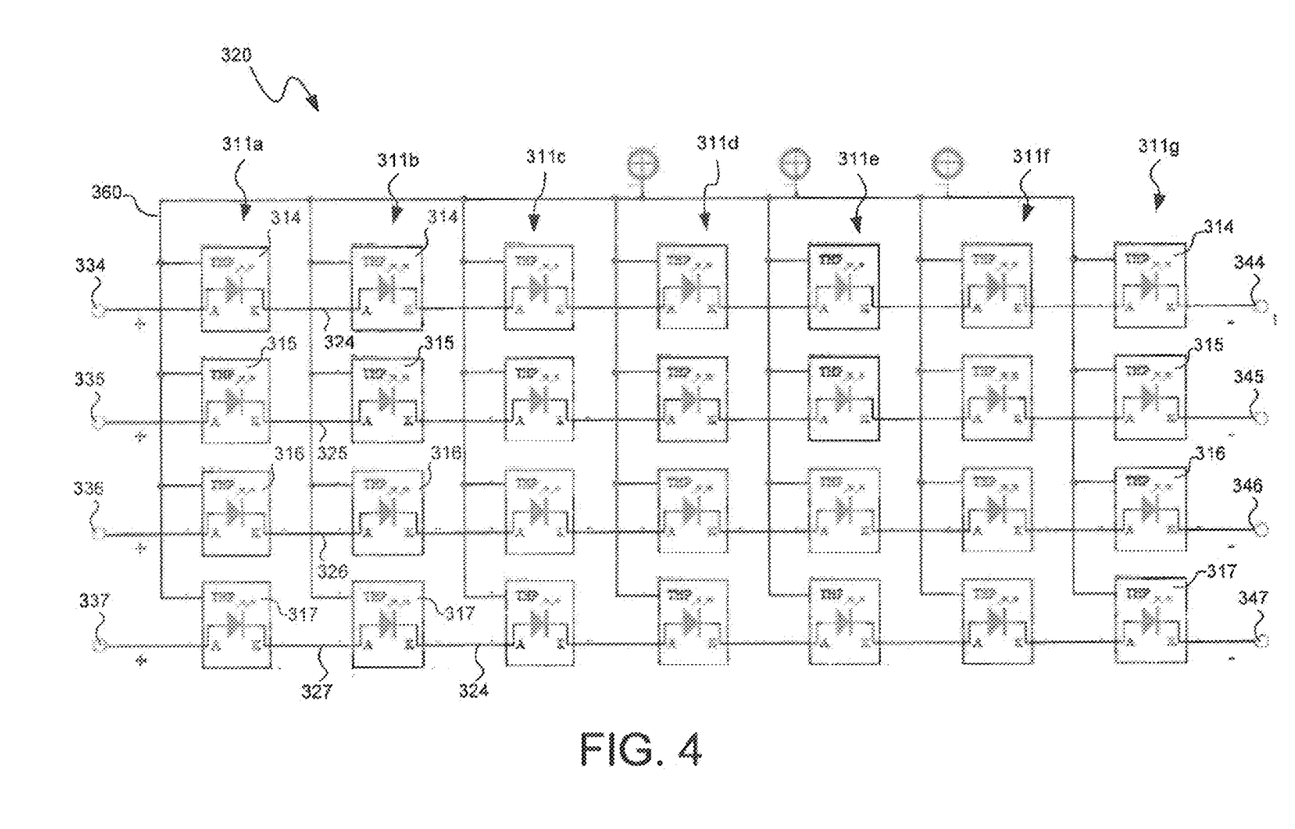
FIG. 4 is a schematic view of parallel circuits including the solid state light sources from the arrangement shown in FIG. 3.

FIG. 4 shows the respective LED chips 314-317 in each of the LED sets 311a-g connected in electrical series to form parallel LED circuits 320 connected to respective channels corresponding to each of the LED colors. In the illustrated embodiment with four (4) colors, for example, first color LED chips 314 are connected in electrical series defining a first string of LED chips 314, second color LED chips 315 are connected in electrical series defining a second string of LED chips 315, third color LED chips 316 are connected in electrical series defining a third string of LED chips 316, and fourth color LED chips 317 are connected in electrical series defining a fourth string of LED chips 317. The respective LED chips 314-317 are connected from anode to cathode by conductive paths 324-327, and the parallel LED circuits 320 are terminated at each end with anode terminal pads 334-337 and cathode terminal pads 344-347. The anode terminal pads 334-337 and cathode terminal pads 344-347 are electrically connected to driver circuitry (not shown). The LED chips 314-317 in each of the LED sets 311a-g may also be thermally coupled to one or more thermally conductive portions 360 for conducting heat away from the LED chips 314-317 to dissipate heat.

Figure 5:
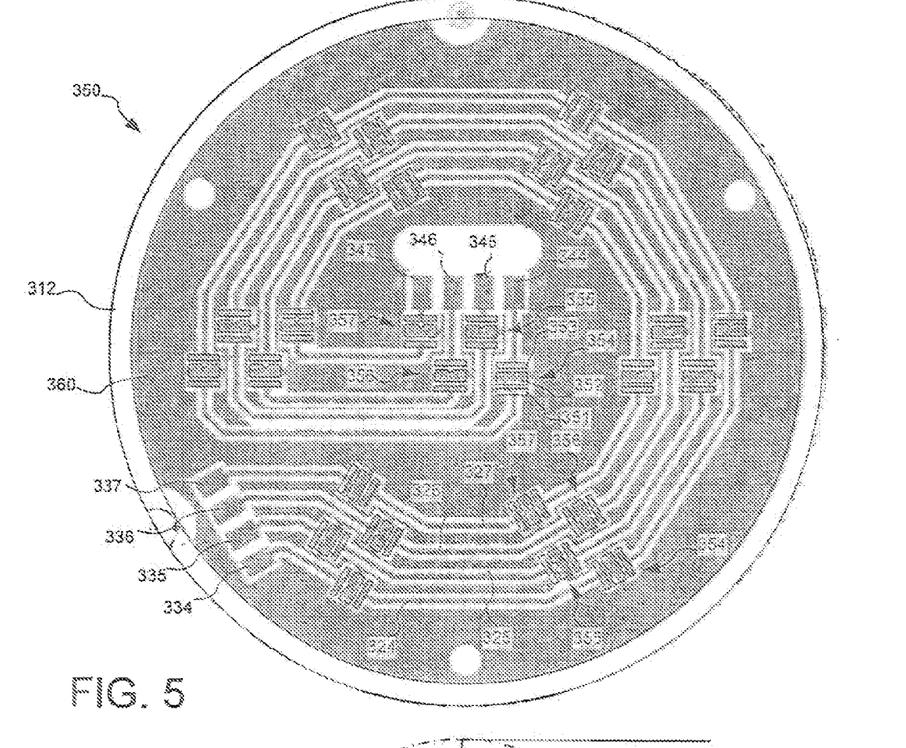
FIG. 5 is a top view of a printed circuit board (PCB) layout for the arrangement of solid state light sources shown in FIG. 3.

FIG. 5 shows a PCB layout 350 on the substrate 312 to provide the parallel LED circuits 320 shown in FIG. 4. LED connection pads 354-357 for connecting to each of the LED chips 314-317 (not shown in FIG. 5) are located in series along the respective conductive paths 324-327 extending from the anode terminal pads 334-337 to the cathode terminal pads 344-347. As shown in greater detail in FIG. 6, the LED connection pads 354-357 each include an anode connection pad 351 for electrically connecting to an anode of a respective LED chip and a cathode connection pad 353 for electrically connecting to a cathode of a respective LED chip. Each of the LED conductive paths 324-327 connect LED anode pads 351 to adjacent LED cathode pads 353. The conductive paths 324-327 are arranged without crossing each other on the substrate 312 to provide the parallel connections between adjacent LED connection pads 354-357.

Figure 6:
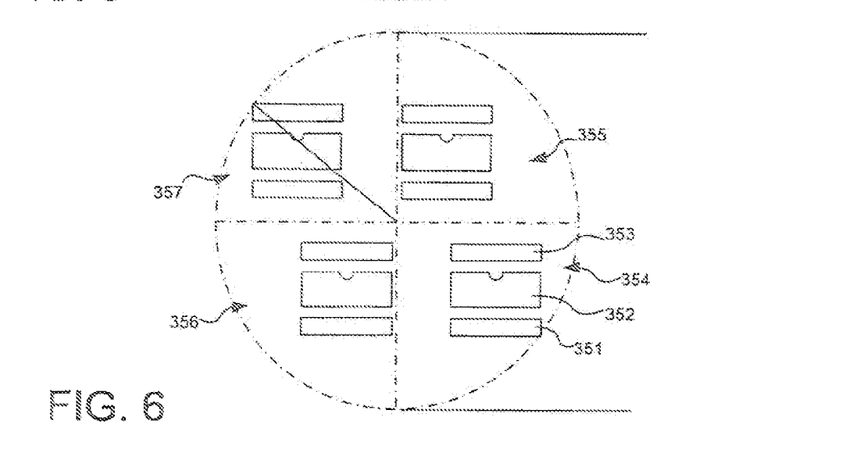
FIG. 6 is an enlarged view of electrode connection pads for a solid state light source set from the printed circuit board (PCB) layout shown in FIG. 4.

The LED connection pads 354-357 also include a thermal connection pad 352 between the anode connection pad 351 and the cathode connection pad 353 for thermally connecting to a thermal pad of a respective LED chip. The thermal connection pads 352 are connected to thermally conductive portions 360 on the substrate 312 to conduct heat away from the LED chips and provide heat dissipation. As shown, the thermally conductive portions 360 are separated from the conductive paths 324-327 and may extend across substantially the entire remaining area of the substrate 312 (i.e., the area without electrically conductive paths or pads) to increase heat dissipation.

In one example, the substrate 312 is a metal core PCB and the conductive paths 324-327 are formed as traces of electrically conductive material on one layer surface. The thermally conductive portions 360 may also be formed from thermally conductive material on the same layer surface. The conductive paths 324-327 and thermally conductive portions 360 may be isolated with dielectric materials. The arrangement of LED chips described herein thus simplifies the circuit design by allowing use of a metal core PCB with a single surface layer for parallel electrical connections without crossing and for heat conduction and dissipation. Using a PCB with this layout thus provides a better solution for thermal conductivity and heat dissipation for all LEDs, which provides relatively stable color mixing for the light engine output.

FIG. 6 also illustrates the relative locations of the LED connection pads 354-357 and thus the LED chips within each LED set. As shown, the LED connection pads 354-357 for one LED set may be located within an imaginary circle and spaced such that each of the LED connection pads 354-357 are located within a different quadrant of the imaginary circle. The relative locations of the LED connection pads 354-357 thus are close enough to facilitate color mixing while allowing sufficient spacing for connecting the LED anode pad 351 and the LED cathode pad 353 to the respective conductive paths 324-327 and for connecting the thermal connection pad 352 to the respective thermally conductive portions 360, as shown in FIG. 5.

Figure 7:
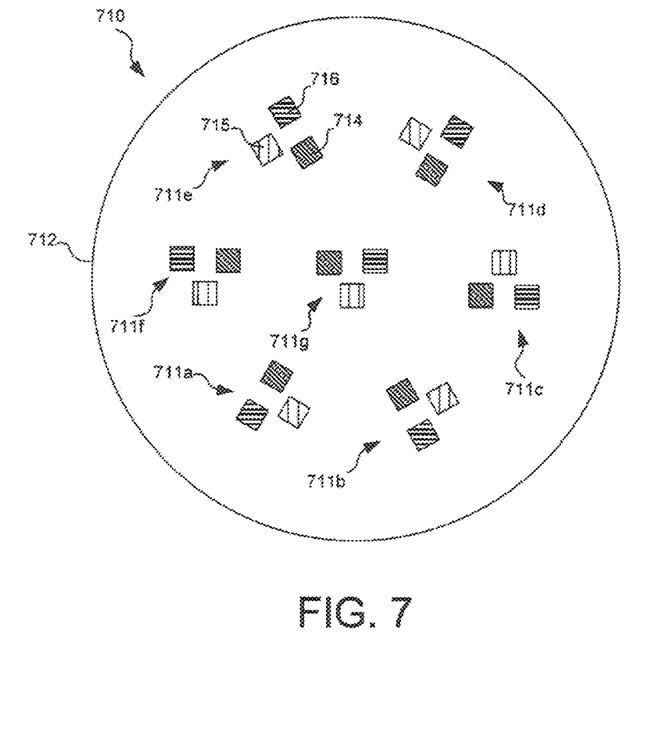
FIG. 7 is a schematic top view of another arrangement of solid state light sources according to embodiments disclosed herein.

FIG. 7 shows another embodiment of an LED arrangement 710 including a circular array of LED sets 711a-g with only three different color LED chips 714-717 in each of the LED sets 711a-g. The LED chips 714-717 may include, for example, an amber or red LED chip 714, a mint or green LED chip 715, and a blue LED chip 716. In this embodiment, the LED sets 711a-g are mounted on a substrate 712 in a circular array with at least some of the LED chips 714-717 skewed relative to other LED chips 714-717. The LED chips 714-717 of each respective color may be connected in electrical series with conductive paths that do not overlap to form parallel LED circuits, as described above.

Accordingly, arrangements of LEDs, consistent with the embodiments described herein, allow uniform and efficient color mixing with a simplified circuit design that facilitates heat dissipation.

Although the illustrated embodiments show specific examples of LED arrangements with LED sets and/or arrangements of LED chips, other patterns, numbers, sizes, combinations and colors of LED chips may also be arranged in LED sets and/or in a circular array or other non-rectangular array. The number, size and arrangement of the LED chips may be determined based on the desired properties of the color-mixing LED light source (e.g., power input, flux, efficacy, source diameter, brightness, color uniformity, and CRI). Also, each of the illustrated embodiments is not intended to be exclusive, and additional LED sets and/or LED chips may be coupled at other locations on the substrates in addition to or outside of the patterns and arrangements shown. Other components, such as a photovoltaic chip, may also be coupled to the substrates.

The term "coupled" as used herein refers to any connection, coupling, link or the like by which signals carried by one system element are imparted to the "coupled" element. Such "coupled" devices, or signals and devices, are not necessarily directly connected to one another and may be separated by intermediate components or devices that may manipulate or modify such signals. Likewise, the terms "connected" and "coupled" as used herein in regard to mechanical or physical connections or couplings are relative terms and do not require a direct physical connection. The term "thermally coupled" refers to a connection or coupling by which heat may be conducted.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "first," "second," "third," and the like herein do not denote any order, quantity, or importance, but rather are used to distinguish one element from another. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

GLOSSARY 100 lamp 110 arrangement of LEDs 111 LED set 112 substrate 114-116 LED chips 118 dome 120 faceted reflector 130 diffuser 200 TIR optics 222 faceted sidewalls 224 textured top surface 310 LED arrangement 311a-g LED sets 312 substrate 314-317 LED chips 320 parallel LED circuits 324-327 conductive paths 334-327 anode terminal pads 344-347 cathode terminal pads 350 PCB layout 351 anode connection pad 352 thermal connection pad 353 cathode connection pad 354-357 LED connection pads 360 thermally conductive portions 710 LED arrangement 712 substrate 711a-g LED sets 714-716 LED chips

What is claimed is:

1. An arrangement of solid state light sources, comprising:
   a substrate (112, 312, 712); and
   a plurality of solid state light source sets (111, 311a-g, 711a-g) arranged on respective solid state light source regions of the substrate (112, 312, 712), each of the solid state light source sets including at least a first color solid state light source chip (114, 314, 714), a second color solid state light source chip (115, 315, 715), and a third color solid state light source chip (116, 316, 716),
   wherein within each said light source set (111, 311a-g, 711a-g) said first, second, and third solid state light source chips (114-115, 314-316, 714-716) are coupled to the substrate (112, 312, 712) and are arranged immediately adjacent to each other, the first color solid state light source chip (114, 314, 714) being configured to emit light of a first wavelength, the second color solid state light source chip (115, 315, 715) being configured to emit light of a second wavelength different than the first wavelength, and the third color solid state light source chip (116, 316, 716) being configured to emit light of a third wavelength different than the first and the second wavelengths,
   wherein each of the solid state light source sets (111, 311a-g, 711a-g) is immediately adjacent at least two other solid state light source sets (111, 311a-g, 711a-g), wherein the solid state light source chips (114-115, 314-316, 714-716) in at least one of the solid state light source sets (111, 311a-g, 711a-g) are skewed relative to the solid state light source chips(114-115, 314-316, 714-716) in at least another of the solid state light source sets (111, 311a-g, 711a-g), and
   wherein at least a subset of the solid state light source sets (111, 311a-g, 711a-g), said subset comprising at least half of all the solid state light source sets (111, 311a-g, 711a-g) on said substrate (112, 312, 712), is located on an imaginary circle (318), respective said solid state light source sets (111, 311a-g, 711a-g) within said subset being spaced from an immediately adjacent solid state light source set (111, 311a-g, 711a-g) by a distance exceeding a separation amount between immediately adjacent first, second, and third solid state light source chips (114-115, 314-316, 714-716) within each solid state light source set (111, 311a-g, 711a-g), and
   wherein the first color solid state light source chips (114, 314, 714) are connected in electrical series defining a first string comprising a plurality of said first color solid state light source chips (114, 314, 714), the second color solid state light source chips (115, 315, 715) are connected in electrical series defining a second string comprising a plurality of said second color solid state light source chips (115, 315, 715, and the third color solid state light source chips (116, 316, 716) are connected in electrical series defining a third string comprising a plurality of said third color solid state light source chips (116, 316, 716), and
   wherein the first, second and third strings of solid state light source chips (114-116, 314-316, 714-716) are arranged in approximate concentric first, second and third circles each generally concentric with said imaginary circle (318).

2. The arrangement of solid state light sources of claim 1, wherein the solid state light source chips (114-116, 314-316, 714-716) form a non-rectangular array on the substrate (112, 312, 712).

3. The arrangement of solid state light sources of claim 1, wherein the solid state light source sets (111, 311a-g, 711a-g) form a circular array on the substrate (112, 312, 712).

4. The arrangement of solid state light sources of claim 1, wherein a ratio of first color solid state light source chips (114, 314, 714) to second color solid state light source chips (115, 315, 715) in each of the solid state light source sets (111, 311a-g, 711a-g) is the same as the ratio of first color solid state light source chips (114, 314, 714) to second color solid state light source chips (115, 315, 715) on the substrate (112, 312, 712).

5. The arrangement of solid state light sources of claim 1, wherein the first wavelength corresponds to light of a green color, and wherein the second wavelength corresponds to light of a red color.

6. The arrangement of solid state light sources of claim 1, wherein the first wavelength corresponds to light of a green color, wherein the second wavelength corresponds to light of a red color, and wherein the third wavelength corresponds to light of a blue color.

7. The arrangement of solid state light sources of claim 1, wherein each of the solid state light source sets (111, 311a-g, 711a-g) includes a predefined pattern of only one of each said first, second, and third color solid state light source chips (114-116, 314-316, 714-716).

8. The arrangement of solid state light sources of claim 1, wherein each of the solid state light source sets (111, 311a-g, 711a-g) provides a first to second to third color solid state light source chip ratio of 1:1:1.

9. The arrangement of solid state light sources of claim 1, further comprising a further said solid state light source set (311g) disposed at approximately a center of said imaginary circle (318).

10. The arrangement of solid state light sources of claim 1, wherein the first, second and third color solid state light source chips (114-116, 314-316, 714-716) comprise light emitting diodes (LEDs).

11. The arrangement of solid state light sources of claim 1, wherein each of the solid state light source sets (311*a-g*) includes a fourth color solid state light source chip (317) configured to emit white light.

12. The arrangement of solid state light sources of claim 1, wherein each of the solid state light source sets (311*a-g*) includes a fourth color solid state light source chip (317) configured to emit light of a fourth wavelength, said fourth wavelength being different than said first, second and third wavelengths.

13. The arrangement of solid state light sources of claim 12, wherein each of the solid state light source sets (311*a-g*) includes a predefined pattern of only one of each said first, second, third and fourth color solid state light source chips (314-317).

14. The arrangement of solid state light sources of claim 12, wherein the first wavelength corresponds to light of a green color, wherein the second wavelength corresponds to light of a red color, wherein the third wavelength corresponds to light of a blue color, and wherein the fourth wavelength corresponds to light of a yellow color.

15. The arrangement of solid state light sources of claim 1, wherein the solid state light source chips (114-116, 314-317, 714-716) each comprise a die packaged with a respective optic.

* * * * *